United States Patent
Kozawa et al.

(10) Patent No.: US 7,122,288 B2
(45) Date of Patent: Oct. 17, 2006

(54) NEGATIVE RESIST COMPOSITION, A METHOD FOR FORMING A RESIST PATTERN THEREOF, AND A METHOD FOR FABRICATING A SEMICONDUCTOR DEVICE

(75) Inventors: Miwa Kozawa, Kawasaki (JP); Koji Nozaki, Kawasaki (JP); Keiji Watanabe, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 97 days.

(21) Appl. No.: 10/097,818

(22) Filed: Mar. 15, 2002

(65) Prior Publication Data

US 2002/0177070 A1    Nov. 28, 2002

Related U.S. Application Data

(63) Continuation-in-part of application No. 09/785,306, filed on Feb. 20, 2001, now abandoned.

(30) Foreign Application Priority Data

Mar. 28, 2000 (JP) .............................. 2000-089790
Mar. 28, 2001 (JP) .............................. 2001-093727

(51) Int. Cl.
  *G03F 7/038* (2006.01)
  *G03F 7/004* (2006.01)
(52) U.S. Cl. ................................. 430/270.1
(58) Field of Classification Search ............. 430/280.1, 430/270.1
See application file for complete search history.

(56) References Cited

U.S. PATENT DOCUMENTS

| | | | | |
|---|---|---|---|---|
| 4,491,628 A | | 1/1985 | Ito et al. ..................... | 430/176 |
| 5,958,648 A | * | 9/1999 | Nishimura et al. ...... | 430/270.1 |
| 5,968,713 A | * | 10/1999 | Nozaki et al. .............. | 430/326 |
| 6,140,025 A | * | 10/2000 | Imai et al. ................... | 430/325 |
| 6,146,806 A | * | 11/2000 | Maeda et al. ............. | 430/270.1 |
| 6,190,833 B1 | * | 2/2001 | Shiota et al. ............. | 430/270.1 |
| 2001/0026901 A1 | * | 10/2001 | Maeda et al. ............. | 430/270.1 |

FOREIGN PATENT DOCUMENTS

| | | | |
|---|---|---|---|
| JP | 06-16804 | | 1/1994 |
| JP | 09-090637 | | 4/1997 |
| JP | 11-065116 A | * | 3/1999 |
| JP | 11258798 A | * | 9/1999 |
| JP | 11-305436 | | 11/1999 |

(Continued)

OTHER PUBLICATIONS

Fujitsu LTD, English Machine translation of JP 11-305436 with a publication date of Nov. 5, 1999. Translation obtained from Patent Abstracts of Japan, Japanese Patent Office.*

(Continued)

*Primary Examiner*—Cynthia Hamilton
(74) *Attorney, Agent, or Firm*—Armstrong, Kratz, Quintos, Hanson & Brooks, LLP

(57) ABSTRACT

A negative resist composition containing an alkaline-soluble resin as a base material, in which an oxetane structure represented by the following formula (1):

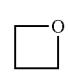

(1)

is contained in a structure of the alkaline-soluble resin or in a structure of a compound used in combination with the alkaline-soluble resin, is disclosed.

29 Claims, 2 Drawing Sheets

FOREIGN PATENT DOCUMENTS

| JP | 11-311860 | 11/1999 |
|---|---|---|
| JP | 2000-122288 | 4/2000 |
| JP | 2000-147769 | 5/2000 |
| JP | 2001343748 A * | 12/2001 |
| JP | 200269140 A * | 3/2002 |
| WO | WO 02/08347 A2 * | 1/2002 |
| WO | WO 02/44845 A2 * | 6/2002 |

OTHER PUBLICATIONS

Fujitsu LTD, English Machine translation of JP 2001-343748 with a publication date of Dec. 14, 2001. Translation obtained from Patent Abstracts of Japan, Japanese Patent Office.*

Kansai Paint Co, English Machine translation of JP 11-258798 with a publication date of Sep. 24, 1999. Translation obtained from Patent Abstracts of Japan, Japanese Patent Office.*

U.S. Appl. No. 60/253,907.*

Taiyo Ink MFG LTD, English Machine translation of JP 2002-069140 with a publication date of Mar. 8, 2002. Translation obtained from Patent Abstracts of Japan, Japanese Patent Office.*

AN 2002:907052, CAPLUS, ACS on STN entered STN Nov. 29, 2002, English abstract of JP 2001-343748, 2 pages.*

Derwent-ACC-No. 2002-105526, Derwent-Week 200326, Derwent Information LTD, 2 pages, English Abstract of JP 2001-343748 A, no date.*

Houlihan et al, "Synthesis of Cycloolefin-Maleic Anhydride Alternating Copolymers for 193 nm Imaging", Macromolecules 1997 vol. 30, pp. 6517-6524.*

S. Cho et al., Proc. SPIE, 3999, 62 (2000); "Negative tone 193 nm resists". pp. 62-73 (See spec. p. 3).

Y. Yokoyama et al., J. Photopolym.Sci.Technol., 13(4) pp. 579-588 (2000); "Design of Novel ArF Negative Resist System . . . Acid" (see spec. p. 3).

T. Naito et al., Proc. SPIE, 333, pp. 503-511 (1998) "Negative-type chemically amplified resists for ArF excimer laser lithography" (see spec. p. 2).

Maeda et al., Abstracts of 58$^{th}$ Japan Soc. Of Appl. Physics No. 2, p. 647—3a-Sc-17;(1997) (see spec. p. 2),No translation. Article in Japanese.

A. Katsuyama et al., Abstracted Papers of 3$^{rd}$ Int'l Symposium on 193nm Lithography, p. 51 (1997) (see spec. p. 2).

K. Nozaki et al., J. Photopolym. Sci. Technol. 10(4) pp. 545-550 (1997) (see spec. p. 2).

K. Nozaki et al., Jpn. J.Appl.Phys. 35 L528-530 (1996) (see spec. p. 2).

R.D. Allen et al., Proc. SPIE, 2438, pp. 474-485 (1995) (see spec. p. 2).

K. Nakano et al., Proc. SPIE, 2195 pp. 194-204 (1994) (see spec. p. 2).

K. Nozaki et al., Chem. Mater., 6, pp. 1492-1498 (1994) (see spec. p. 2).

H. Ito et al; Digest of Technical Papers of 1982 Symposium on VLSI Technology; pp. 86-87 (1983) (see spec. p. 2).

* cited by examiner

NEGATIVE RESIST COMPOSITION, A METHOD FOR FORMING A RESIST PATTERN THEREOF, AND A METHOD FOR FABRICATING A SEMICONDUCTOR DEVICE

CROSS-REFERENCE TO RELATED APPLICATION

The present invention is a continuation-in-part application of the U.S. patent application Ser. No. 09/785,306 filed on Feb. 20, 2001 now abandoned.

BACKGROUND OF THE INVENTION

1. Field of the Invention

The present invention generally relates to the art of microfabrication of semiconductor devices, more particularly, to a negative resist composition that can be developed with a basic aqueous solution without causing swelling, a method for forming a fine resist pattern thereof and a method for fabricating a semiconductor device. According to the present invention, a resist material having a lower absorbance and a high sensitivity for shorter wavelength radiation and high dry etching resistance can be provided. Thus, a semiconductor integrated circuit such as VLSI and ULSI etc., as well as other devices needing microfabrication such as a magnetic resistive head, and the like, can be advantageously fabricated.

2. Description of the Related Art

A photolithography technique using krypton fluoride excimer laser (wavelength: 248 nm, as referred to KrF hereinafter) has been dominating for mass production of highly miniaturized semiconductor devices due to availability of chemical amplification type resist such as the one proposed by H. Ito, et al. For example, reference should be made to J. M. J. Frechet et al., Proc Microcircuit Eng., 260 (1982), H. Ito et al., Digest of Technical Papers of 1982 Symposium on VLSI Technology, 86 (1983), H. Ito et al., "Polymers in Electronics", ACS Symposium Series 242, and T. Davidson et al., ACS, 11 (1984), U.S. Pat. No. 4,491,628 (1985).

Recently, in relation to fabrication of a higher integrated circuit devices such as Gbit DRAMs, a lithography technique using ArF (Argon fluoride) excimer laser (wavelength: 193 nm) has been actively studied, wherein the ArF excimer laser emits a shorter wavelength radiation as compared with the KrF excimer laser. Since conventional phenol resins have a strong optical absorbance at such shorter wavelengths, the resin material constituting the base of the resist has to be changed. Thus, there is an urgent need of developing a resist material applicable for such shorter wavelength radiations.

As a chemical amplification type resist applicable for the wavelength of ArF radiation, positive resists have been actively studied (see, for example, K. Nozaki et al., Chem. Mater., 6, 1492 (1994), K. Nakano et al., Proc. SPIE, 2195, 194 (1994), R. D. Allen et al., Proc. SPIE, 2438, 474 (1994), Japanese Laid-Open patent application No.9-90637, K. Nozaki et al., Jpn. J. Appl. Phys., 35, L528 (1996), and K. Nozaki et al., J. Photopolym. Sci. Technol., 10(4), 545–550 (1997)).

However, there are few reports about single layer negative chemical amplification type resists. Most of the resists are cross-linking type resists.

For example, as described in A. Katsuyama et al., Abstracted Papers of Third International Symposium on 193 nm Lithography, 51 (1997), or in Maeda et al., Abstracts of the 58$^{th}$ Japan Society of Applied Physics No.2, 647 (3a-Sc-17) (1997), or in T. Naito et al., Proc. SPIE, 3333, 503 (1998), Japanese Laid-Open patent application No.2000-122288, or in Japanese Laid-Open patent application No.2000-147769, a cross-linking type resist is utilized for patterning, there is a report of cross-linking type resist in which there is caused a difference of solubility to a developer between an exposed area and an unexposed area by increasing the molecular weight as a result of cross-linking reaction at the exposed area. However, such an approach cannot avoid the problem of swelling of the exposed patterns, and the use thereof in the art of microfabrication of semiconductor devices is rather limited.

Recently, there is a report of a single-layer negative chemical amplification type resist that uses a polarity change, which in turn is caused by an intra-molecular lactonization that uses a hydroxycarboxylic acid structure (for example, reference should be made to Y. Yokoyama et al., J. Photopolym. Sci. Technol., 13(4), 579 (2000)). Further, there is a report of a single-layer negative chemical amplification resist that uses a pinacol rearrangement (for example, reference should be made to S. Cho et al., Proc. SPIE, 3999, 62 (2000)).

However, in the case of using the intra-molecular lactonization, there is a problem in that proportion of the polarity change is relatively small and it is difficult to perform patterning with high contrast. Also, in the case of the pinacol rearrangement, there are problems such as adhesion property to a substrate due to the inclusion of fluorine and preservation stability caused as a result of inclusion of maleic anhydride.

Thus, the resist utilizing pinacol arrangement has not been established. Although the inventors previously developed a single-layer negative chemical amplification type resist using polarity change that uses an inter-molecular protection reaction (Japanese Laid-Open patent application No.11-311860 and No.11-305436), there was a problem that no enough reactivity was achieved because of the fact that the reaction is an inter-molecular reaction.

A negative resist can be advantageously used when it is difficult to produce a mask with a positive resist or when the exposed area is small as in the case of the gate of a transistor, due to the fact that the unexposed area of the resist is dissolved. Further, the use of such a negative resist is advantageous also in the case of forming a phase shift mask used in the-technology of super-resolution exposure for obtaining a resolution equal to or less than the wavelength used for the exposure, and also in the Levenson mask, which is used for enhancing optical images.

Thus, a negative resist is hoped for also in the art of ArF exposure. These masks formed of the negative resist are considered also as being applicable to the case in which the resolution of equal to or less than 130 nm is required in combination with the use of ArF excimer radiation source. Thus, there is an urgent demand for a resist capable of resolving such a fine pattern without causing swelling.

Meanwhile, with increase of integration density of semiconductor devices, the number of interconnection layers is increasing also in addition to the miniaturization of the line width. In relation to such a demand, the requirement imposed to a resist material for lithographic process is becoming stringent every year. In addition to the resolution, the dimensional accuracy after etching has emerged recently as an important factor of a resist material. With the shifting of the exposure wavelength to a shorter side, it is expected that there appear difficulty in keeping up a sufficient transparency for the resist material. Thus, it is expected that the thickness of the resist layer becomes thin in such a future resist material. When the thickness of the resist layer is thus reduced, the etching property of the resist layer becomes a paramount problem in the fabrication process of miniaturized semiconductor devices. Similar problems appear also in the case of fabricating any highly miniaturized devices that use a highly miniaturized photolithographic patterning process such as the fabrication process of magneto-resistive heads for use in high-density magnetic recording.

Meanwhile, there is a proposal of surface imaging technique as an effective technology solving the foregoing problems. Particularly, there is a proposal of bilayer resist process that uses a resist composition containing silicon. The bilayer method comprises the steps of forming a lower resist layer by applying a solution containing an organic resin with a thickness of about 0.5 μm, followed by formation of an upper resist layer on the lower resist layer thus formed, with a thickness of about 0.1 μm. Next, the upper resist layer is patterned by an exposure and developing process to form a upper resist pattern, and the lower resist layer is subjected to an etching process by using the upper resist pattern as a mask. According to such a process, it becomes possible to form a resist pattern having a high aspect ratio.

The resist material for use in such a bilayer method is required to satisfy various requirements such as excellent exposure resolution, excellent storage stability, capability of being developed by basic aqueous solutions (alkaline developability), in other words, in addition to excellent resistance to oxygen reactive etching (hereinafter referred to as $O_2$-RIE). At the present stage, however, there is no commercially available resist material that satisfies all of the above requirements.

SUMMARY OF THE INVENTION

Accordingly, it is a general object of the present invention to provide a novel and useful negative resist composition wherein the foregoing problems are eliminated.

Another and more specific object of the present invention is to provide a negative resist composition capable of forming fine, miniaturized patterns, having a practical optical sensitivity against short wavelength radiations, and being developed by a basic aqueous solution without causing swelling.

Another object of the present invention is to provide a resist composition capable of being exposed by an exposure radiation having a wavelength in the deep ultraviolet region, such as the one produced by a KrF excimer laser or an ArF excimer laser, while maintaining excellent dry etching resistance.

Another object of the present invention is to provide a high-sensitivity resist composition capable of providing fine patterns while simultaneously providing high contrast and high resolution, by increasing the polarity difference between at an exposed area and an unexposed area.

Another object of the present invention is to provide a high-sensitivity resist composition having a high $O_2$-RIE resistance and capable of being developed by a basic aqueous solution, so that the resist composition is applicable for the formation of the upper layer resist film in a multi-layer resist process.

Another object of the present invention is to provide a method of forming a resist pattern using such resist composition.

Another object of the present invention is to provide a method for fabricating a semiconductor device by using such resist composition as for the pattern formation material.

Another object of the present invention is to provide a negative resist composition containing an alkaline-soluble resin as a base material, in which an oxetane structure represented by the following formula (1):

(1)

is contained in a structure of the alkaline-soluble resin or in a structure of a compound used in combination with the alkaline-soluble resin.

Another object of the present invention is to provide a method of forming a negative resist pattern comprising the steps of:

applying a resist composition on a substrate to form a resist film, the resist composition containing an alkaline-soluble resin as a base material, in which an oxetane structure represented by the following formula (1):

(1)

is contained in a structure of the alkaline-soluble resin or in a structure of a compound used in combination with the alkaline-soluble resin;

exposing the resist film to radiation for imaging selectively;

developing the exposed resist film with a basic aqueous solution to form the negative resist pattern.

Another object of the present invention is to provide a method for fabricating a semiconductor device comprising the steps of:

applying a resist composition on a substrate to form a resist film, the resist composition containing an alkaline-soluble resin as a base material, in which an oxetane structure represented by the following formula (1):

(1)

is contained in a structure of the alkaline-soluble resin or in a structure of a compound used in combination with the alkaline-soluble resin;

exposing the resist film to radiation for imaging selectively;

developing the exposed resist film with a basic aqueous solution to form a negative resist pattern.

Another object of the present invention is to provide a method for forming a negative resist pattern comprising the steps of:

applying a first resist composition on a substrate to form a lower layer resist film;

applying a second resist composition on the lower layer resist film to form an upper layer resist film, the second resist composition containing an alkaline-soluble resin as a base material, in which an oxetane structure represented by the following formula (1):

(1)

is contained in a structure of the alkaline-soluble resin or in a structure of a compound used in combination with the alkaline-soluble resin;

exposing the upper layer resist film to radiation for imaging selectively;

developing the exposed upper layer resist film with a basic aqueous solution to form a resist pattern;

etching the lower layer resist film by using the resist pattern as for a mask to form the negative resist pattern through the lower resist film and the upper resist film.

Other objects and further features of the present invention will become apparent from the following detailed description.

DESCRIPTION OF THE PREFERRED EMBODIMENTS

Principle

Figure 1:
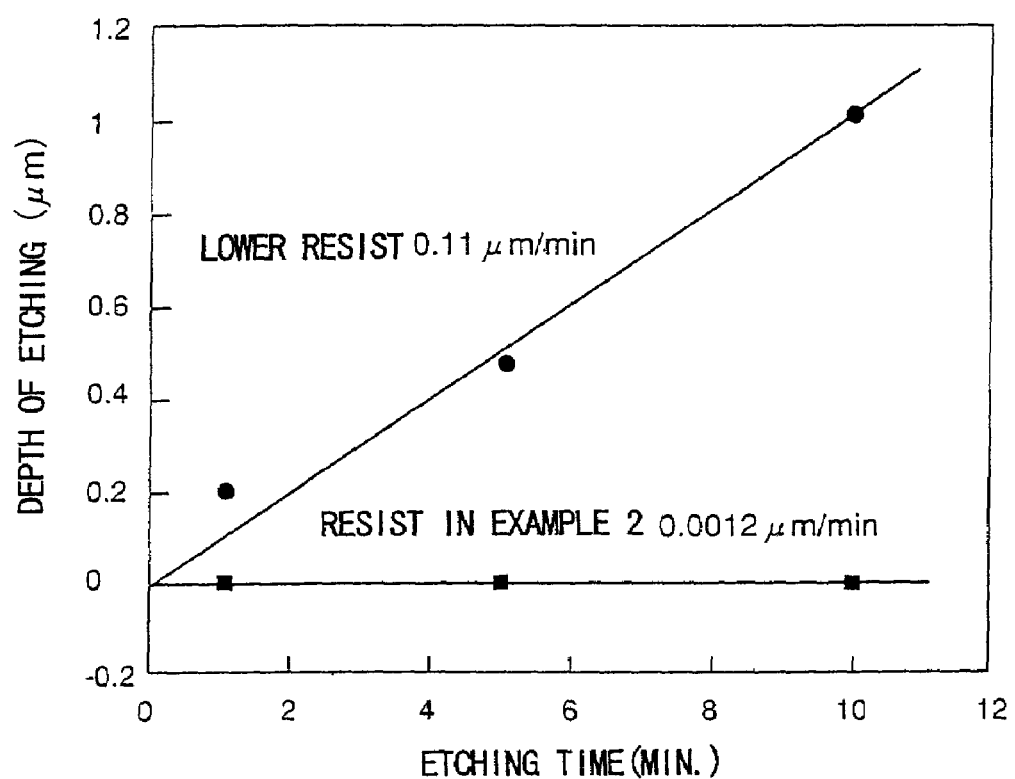
FIG. 1 is a diagram showing the result of an $O_2$-RIE resistance test in a bilayer resist process conducted by using a resist composition according to the present invention.

The inventors actively studied in order to solve the problems described above. As a result, the inventors have found that, in a chemical amplification type resist composition that uses, as a base resin, a polymer having an alkaline-soluble group and thus forming a film soluble to a basic aqueous solution, it is effective to introduce an oxetane structure to the alkaline-soluble polymer or to a compound used in combination with the alkaline-soluble polymer.

Another object of the present invention is to provide a negative resist composition comprising an alkaline-soluble resin as for a base resin, wherein the alkaline-soluble resin or a compound used in combination with the alkaline-soluble resin contains an oxetane structure represented by the following formula (1).

(1)

Preferably, the resist composition is provided in the form of a chemical amplification type resist. Thus, the resist composition according to the present invention may also include a photoacid generator that produces an acid reactive to the oxetane structure when the photoacid generator is exposed to a radiation at the time of an imaging process. Thereby, although the resist composition itself is soluble to a basic aqueous solution, after it is exposed to radiation for imaging, an exposed area on the resist composition become alkaline-insoluble and can be developed by using a basic aqueous solution. While the amount of the photoacid generator depends on the acid strength of the acid generated after it is exposed to the radiation emitted from an exposure source, the amount is preferably within the range from 0.1 to 50% by weight (percentage relative to weight of a polymer) and more preferably within the range from 1 to 15% by weight.

An alkaline-soluble polymer used as for a substrate resin is preferably a polymer containing at least one kind of substituent selected from the group consisting of a carboxyl group, a phenolic hydroxyl group, a N-hydroxyamide group, an oxime group, an imide group, a 1,1,1,3,3,3-hexafluorocarbinol group represented by the formula (2),

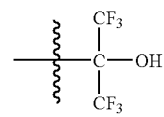

(2)

and a sulfonic acid group in order to obtain alkaline solubility at desired level.

At least one monomer unit constituting the alkaline-soluble polymer is preferably a monomer unit having an acrylate-based monomer unit, a methacrylate-based monomer unit, a vinylphenol-based monomer unit, an N-substituted maleimide-based monomer unit, a styrene-based monomer unit, or a monomer unit having a polycyclic alicyclic hydrocarbon group comprising a plurality of ring structures represented by norbornene. A monomer unit having a structure represented by an adamantyl group or a norbornyl group, etc. in the polycyclic alicyclic hydrocarbon group is more preferable.

If the alkaline-soluble polymer is a copolymer, a monomer unit polymerized with the monomer unit having an alkaline-soluble group may have any structure as far as the polymer maintains the nature of alkaline solubility to a developer. Further, if the alkaline-soluble polymer is a three-component polymer, the monomer unit having an alkaline-soluble group may be combined with two kinds of monomer units having any structures as far as the polymer maintains the alkaline solubility to a developer, similarly to the case described above. Further, combination of the three kinds of monomer units is also preferable. In these case, the polymer may contain not only a first monomer unit having an alkaline-soluble group but also a second monomer unit having an alkaline-soluble group and the combination of the two kinds of monomer units is also preferable.

In the alkaline-soluble polymer according to the present invention, the content of the monomer units having the alkaline-soluble group in the polymer is not limited as far as the polymer itself exhibits proper alkaline solubility. However, from the viewpoint of attaining a practical rate of dissolution to an alkali solution (rate of dissolution against 2.38% TMAH developer of about from 100 angstrom/s to 1000 angstrom/s), it is preferable to set the content of a monomer unit having an alkaline-soluble group in the range from 5 to 95 mol %, more preferably from 30 to 70 mol %, provided that the polymer consists of two or more monomer components. If the monomer content is less than 5 mol %, no satisfactory patterning can be achieved because of insufficient alkaline-solubility in the case the alkaline-soluble group has weaker acidity than the carboxyl group. On the other hand, if the content is more than 95 mol %, the rate of dissolution to a basic aqueous solution is too fast in the case the alkaline-soluble group has stronger acidity than a carboxyl group, and the patterning becomes difficult because of the too large solubility. Therefore, it is desirable to control the content of the monomer unit properly, depending on the acidity of the alkaline-soluble group.

In one aspect of the present invention, it is preferable that an alkaline-soluble polymer itself has an oxetane structure therein. In this case, the content of the monomer unit having an oxetane structure in the polymer is not limited as far as the polymer resin itself exhibits proper alkaline-solubility. However, it is desirable to control the rate of the dissolution the polymer to the 2.38% TMAH developer to the range of 0 to 40 angstrom/s at the exposed areas after the post-exposure baking (PEB) process. For example, in the case of the polymer consisting of two or more monomer components, the content of the monomer unit having an oxetane structure is preferably from 5 to 95 mol %, more preferably from 30 to 70 mol %.

According to another aspect of the present invention, it is preferable to combine a compound having an oxetane structure therein with an alkaline-soluble polymer in the resist composition. In this case, although the content of the compound significantly depends on rate of dissolution of the polymer against an alkali solution, it is recommended to use a polymer content of 1 to 80% by weight, and more preferably from 10 to 40% by weight (percentage to the weight of the polymer) in the case the polymer has the above mentioned proper rate of dissolution against the alkali solution.

In the resist composition according to the present invention, the alkaline-soluble resin used as for a base resin is preferably a silicon-containing resin in view of another aspect of the present invention. The silicon-containing resin also has at-least one substituent selected from the group consisting of a carboxyl group, a phenolic hydroxyl group, and a hexafluorocarbinol group represented by the above formula (2).

The silicon-containing resin preferably includes an oxetane structure therein. The silicon-containing resin including an oxetane structure and is suitable for the base resin is preferably a silicon-containing polymer represented by the following formula (3) or (4).

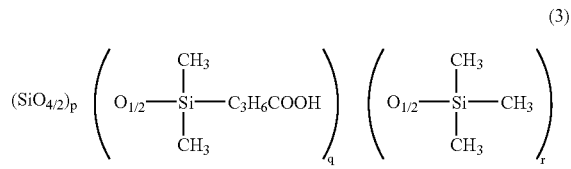

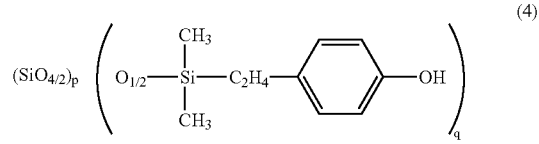

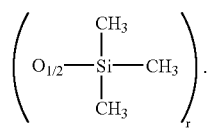

In the above formulae (3) and (4), p, q and r are positive integers respectively.

In yet another aspect, the alkaline-soluble resin used as for the base resin may be combined with a compound having an oxetane structure. The compound having the oxetane structure is preferably a silicon-containing resin represented by the following formula (5).

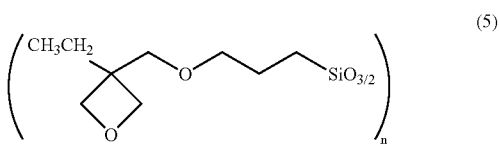

In the above formula (5), n is a positive integer.

The alkaline-soluble polymer for the base resin noted above has preferably a weight-averaged molecular weight of 2,000 to one million, more preferably from 3,000 to 50,000, although the molecular weight may vary widely with the composition and the desired effect of the resist composition.

The resist composition according to the present invention is preferably provided in the form of a solution in which the composition is dissolved in a solvent selected from the group consisting of ethyl lactate, methyl amyl ketone, methyl-3-methoxypropionate, ethyl-3-ethoxypropionate, propylene glycol methyl ether acetate, and a mixture thereof. The resist solution may also contain a solvent selected from the group consisting of butyl acetate, γ-butyrolactone, propylene glycol methyl ether, and a mixture thereof as for a supplementary solvent if necessary. Although the supplementary solvent added to the resist solution may not be required depending on the solubility of the solute, the amount of the supplementary solvent added to a main solvent is generally in the range from 1 to 30% by weight when a solute-having low solubility is employed. The range of 10 to 20% by weight is more preferable.

Also, in order to obtain satisfactory patterning performance, it is desirable that the absorbance of the resist composition is equal to or less than 1.75 at the spectral region (from 157 to 300 nm) of the radiation generated from an exposure source.

In another aspect of the present invention, the present invention provides a method of forming a negative resist pattern using the resist composition according to the present invention. With respect to the method for forming a resist pattern, the resist composition according to the present invention may be used in a single-layer resist process and a multi-layer resist process such as the bilayer resist process or triple-layer resist process.

A method for forming a resist pattern according to the present invention comprises the steps of: applying the resist composition according to the present invention on a substrate to form a resist film; exposing the resist film to radiation for imaging selectively; developing the exposed resist film with a basic aqueous solution to form a negative resist pattern.

Also, when a multi-layer resist method is carried out, a method for forming a resist pattern according to the present invention comprises the steps of: applying a first resist composition on a substrate to form a lower layer resist film; applying the resist composition according to the present invention on the lower layer resist film to form an upper layer resist film; exposing the upper layer resist film to radiation for imaging selectively; developing the exposed upper layer resist film with a basic aqueous solution to form a resist pattern; etching the underlying lower layer resist film by using the resist pattern as for a mask; forming a negative resist pattern consisting of the lower layer resist film and the upper layer resist film thereon.

In the method of forming the resist pattern according to the present invention, a resist film formed on a substrate preferably undergoes heating treatment before and after the resist film is subjected to the selective exposure process. That is, in the method according to the present invention, the resist film is subjected to a pre-bake treatment before the exposure process, wherein it is further preferable that the resist film is subjected to a post-bake treatment (aforementioned PEB) after the exposure process but before the development process.

In the method of forming a resist pattern according to the present invention, a radiation capable of inducing dissociation of the photoacid generator contained in the resist composition is employed as for radiation for the exposure process.

Further, a basic aqueous solution used as for a developer is preferably an aqueous solution containing a metal hydroxide, in which the metal is classified to I group or II group in the periodic table, such as potassium hydroxide. Alternatively, the basic aqueous solution may be the one containing an organic base but a metal ion such as-tetraalkylammonium hydroxide, etc. More preferably, the basic aqueous solution may be an aqueous solution of tetramethylammonium hydoxide (TMAH). An additive such as a surfactant may be added to the basic aqueous solution so as to improve the development effect.

Another aspect of the present invention is to provide a method of producing a semiconductor device comprising of the step of forming the resist pattern described above.

[First Embodiment]

A negative resist composition according to the present invention is characterized by an oxetane structure represented by the above formula (1) contained in the structure of an alkaline-soluble resin used as for a base resin or in the structure of a compound used in combination with the alkaline-soluble resin. Although it is known that a compound having an oxetane structure itself can be utilized as for a photocurable coating material (see Japanese Laid-Open Patent Application No.6-16804), the present invention is characterized by an oxetane structure introduced into the alkaline-soluble resin having excellent dry-etching resistance as a side-chain, or into a compound containing an oxetane structure. According to the present invention, it was found that a resist material particularly suitable for microfabrication of semiconductor devices and the like, can be provided by using an oxetane structure.

As for the behavior of the oxetane structure in the resist composition of the present invention, the oxetane structure is subjected to a ring-open reaction under a certain condition, and the oxetane structure thus experienced the ring-open reaction causes a reaction with an alkaline-soluble group such as hydroxyl group, carboxyl group, and the like. The alkaline-soluble group is lost after the reaction, and the exposed area on the resist film becomes alkaline-insoluble. Thus, a negative pattern is formed after a development process conducted by using a basic aqueous solution. Also, oxetane undergoes a ring-opening polymerization under a certain condition and causes also a decrease of solubility as a result of increase of the molecular weight, which takes place as a result of the cross-linking reaction of the resin. Furthermore, the foregoing reaction causes regeneration of protonic acid, and the chemical amplification reaction achieves a high sensitivity. In the present invention, the pattern formation is achieved primarily by the polarity change, and a pattern having no swelling is obtained.

Also, with respect to the alkaline-soluble polymer used for the base resin in the resist composition of the present invention, a first monomer unit of the copolymer may have a strong alkaline-soluble group such as a carboxyl group and a second monomer unit may have weak alkaline-soluble group such as the one having a lactone stricture, an acid anhydride, and an imide-ring structure, and the like, particularly when the polymer is a three-component copolymer. In this case, it becomes easy to control the rate of dissolution of the base resin to an alkali to a preferred value by controlling the contents of the strong alkaline-soluble group and the weak alkaline-soluble group. Also, it is possible to use a functional group having an etching-resistance for a third monomer unit. This is most preferable for a resist.

In the resist composition according to the present invention, the structure of the alkaline-soluble polymer used for the base resin is not particularly limited as far as the above mentioned conditions, particularly the condition of realizing a proper rate of dissolution to alkali is satisfied. However, in view of obtaining a dry-etching resistance similar to that of Novolak, a polymer consisting of an acrylate monomer unit and/or a methacrylate monomer unit, in which an ester bond is bonded to a polycyclic alicyclic hydrocarbon structure, a vinylphenol polymer, a N-substituted maleimide polymer, a styrene polymer, and a norbornene polymer, etc. are recommended. When an optical source of deep ultraviolet radiations, especially a source emitting radiation with the wavelength of 250 nm or less is used as for the exposure source, an acrylate polymer, a methacrylate polymer, and a norbornene polymer become important due to small absorbance of radiations in this wavelength range. In other words, when a source of deep ultraviolet radiation is used as for an exposure source, it is desirable to employ a polymer having a structure not to contain an aromatic ring, which generally absorbs the radiation substantially at the ultraviolet region, or a chromophore having a large molar absorbance coefficient such as a conjugated double bond, and the like.

When a source of exposure radiation having a short wavelength spectral region such as an ArF excimer laser is used, the use of a polymer having an ester bond bonding to a polycyclic alicyclic hydrocarbon structure represented by an adamantyl group or a norbornyl group, which has high dry-etching resistance described above is recommended. Paricularly, an acrylate polymer, a methacrylate polymer, and a norbornene polymer are recommended because of the requirement of transparency to the wavelength of the exposure radiation (193 nm) and because of the dry-etching resistance.

Further, in the case of using a vacuum ultraviolet light such as $F_2$ laser (wavelength 157 nm) for the radiation source, it is more difficult to maintain the transparency. Thus, combination of fluorine-containing resin represented by a norbornene fluoride polymer and a vinylfluoride polymer is recommended. Alternately, the use of an oxetane structure for the side chain of the unit containing a fluorine unit is recommended.

Although the molecular weight (weight-averaged molecular weight: Mw) of the polymers described above or other alkaline-soluble polymers can be varied in a wide range, preferably it is in the range from 2,000 to 1 million, more preferably in the range of-3,000 to 50,000.

The alkaline-soluble polymers that can be advantageously used in implementation of the present invention, while not being limited to the following materials, comprise the following. It should be noted that l , m, and n in the formula represent the number of monomer units (repeat units) necessary to obtain the weight-averaged molecular weight described above, while $R_1$, $R_2$ and $R_3$ represent arbitrary substituents such as a hydrogen atom, halogen atoms (a chlorine atom and a bromine atom, etc.), lower alkyl groups (a methyl group and an ethyl group, etc.), a cyano group, a fuluoro lower alkyl group and others, and identical to or different from each other, unless otherwise noted.

(1) An acrylate polymer or a methacrylate polymer

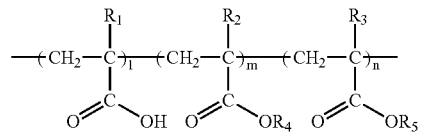

In the structural formula, $R_4$ is, for example, a weak alkaline-soluble group represented by a lactone ring. However, the monomer unit including $R_4$ is elective, as far as rate of dissolution exhibits proper value as for a substrate of the negative resist. $R_5$ is a unit having an oxetane structure.

In addition, the alkaline-soluble polymer may be one having a structure containing an ester bond bonding to a carboxyl group being an alkaline-soluble group as follows.

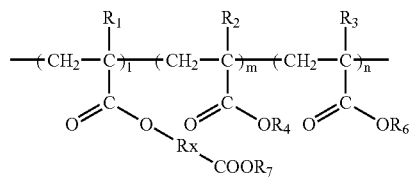

In the above structure, $R_4$ is defined in common with the previous formula. Both $R_6$ and $R_7$ are H atom or an oxetane structure. However they are not the same structure (both H atoms or both oxetane structures). Although $R_x$ may be an arbitrary structure, a polycyclic alicyclic structure is preferred.

(2) A polymer containing a styrene-based unit as an alkaline-soluble polymer as follows

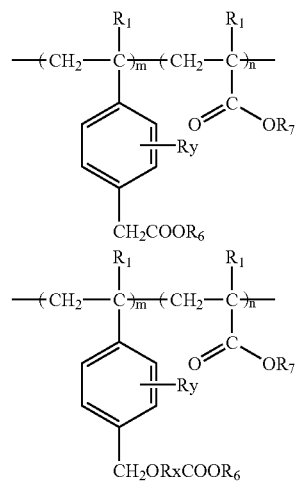

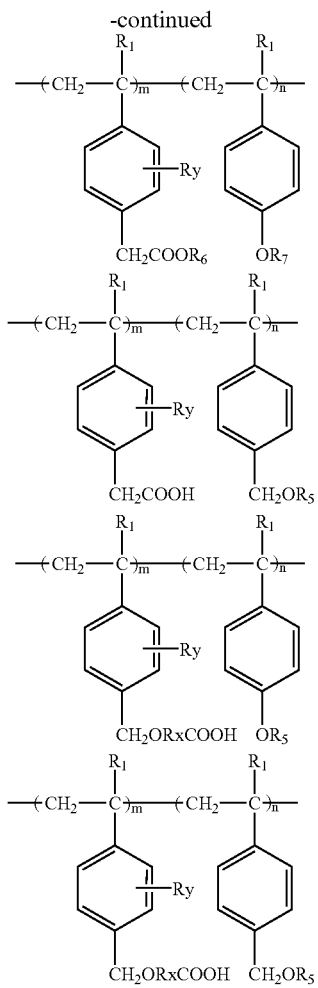

In the structural Formulas, $R_y$ is an arbitrary substituent. It is preferable for Rx to be selected similar to the above mentioned.

(3) A polymer containing a fumaric acid-based unit as follows

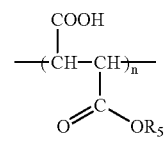

(4) A polymer containing a vinylbenzoic acid-based unit as follows

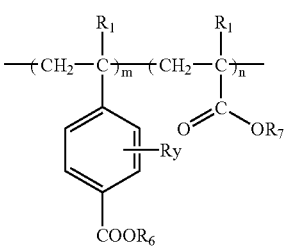

-continued

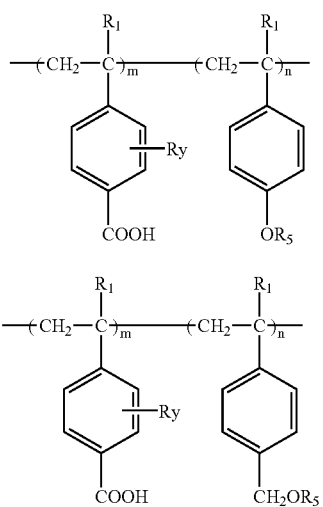

(5) A polymer containing a norbornene-based unit and a derivative thereof as follows

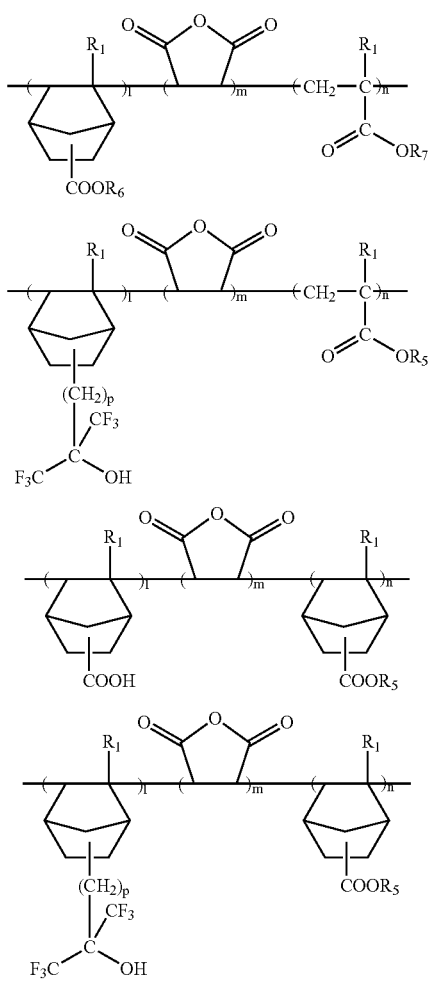

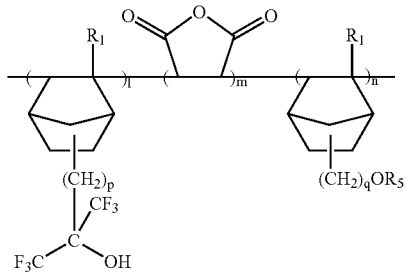

In these structural formulas, p and q are integers of from 0 to 4 respectively, and identical to or different from each other.

(6) A polymer containing an itaconic acid-based unit as follows

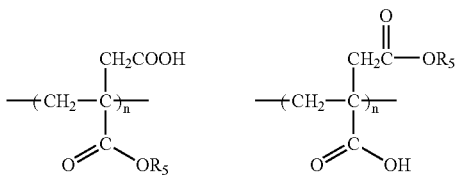

(7) A polymer containing a maleic acid-based unit as follows

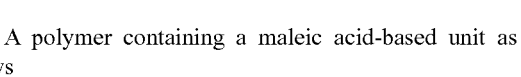

(8) A polymer containing a vinylphenol-based unit as follows

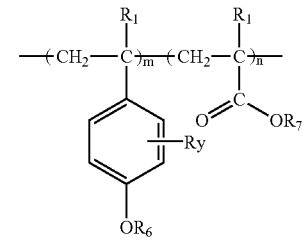

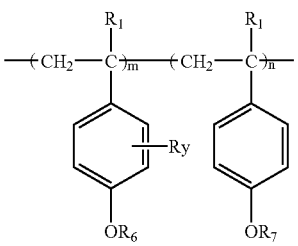

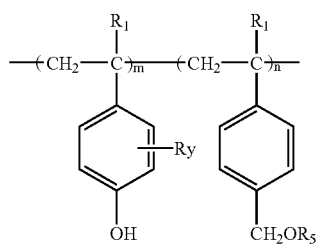

(9) A polymer containing a tetracyclododecanyl-based unit as follows

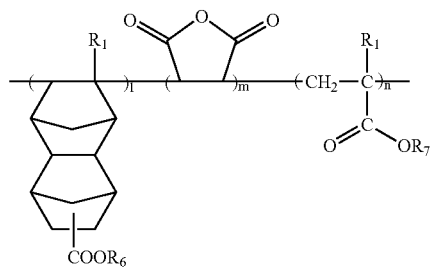

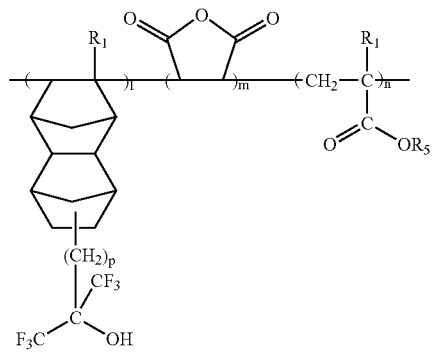

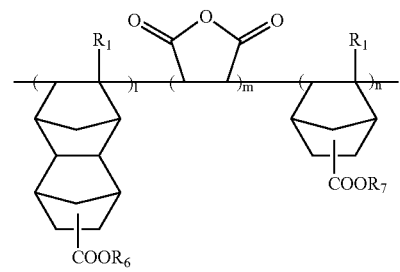

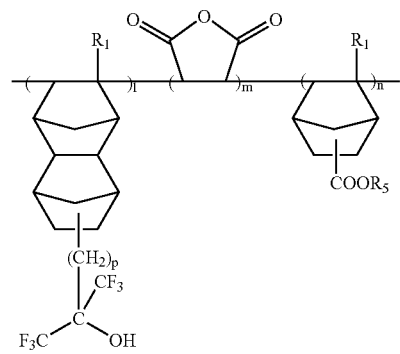

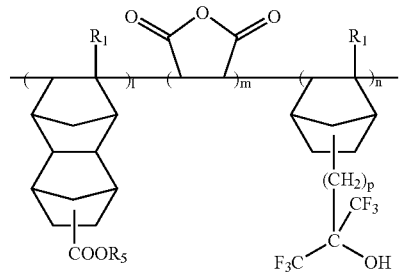

The polymers may be combined with other appropriate monomers to form an arbitrary copolymer (including a copolymer containing equal to or more than three components) as aforementioned.

As further illustrated in detail, an alkaline-soluble polymer usable advantageously in implementation of the present invention is, for example, the materials shown below.

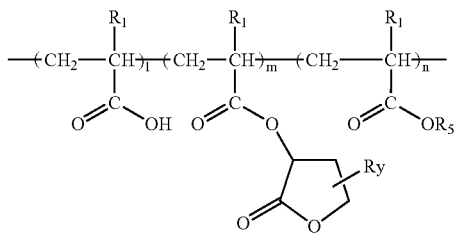

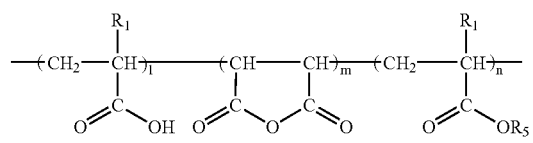

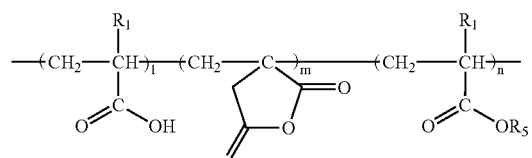

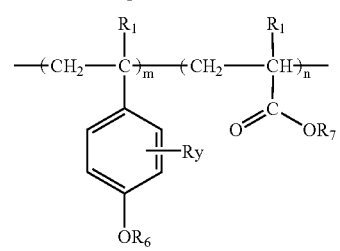

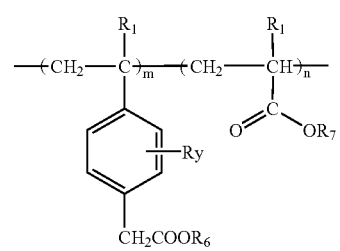

-continued

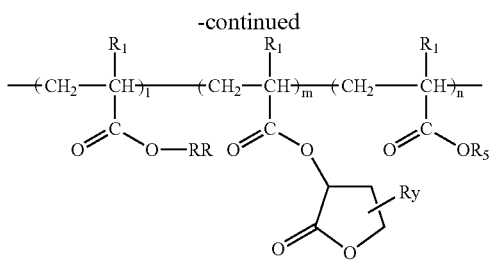

In the above formula, RR is, for example, a substituent as follows.

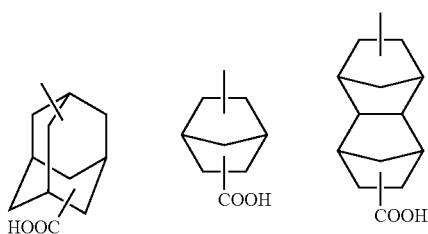

The embodiments illustrated above are merely examples, and the polymers according to the present invention is not limited to the structures described above. In the formula, $R_y$ and $R_5$ are explained before.

In the above structural formula, functional groups advantageously used as for $R_5$, includes, for example, the following structures.

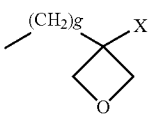

In oxetanes represented by the above formula, g is an integer of from 0 to 4, and X is a hydrogen atom (H) or an alkyl group having 8 or less carbon atoms of which the structure may be a straight chain or a branched chain and may include a ring.

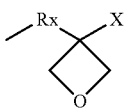

In oxetanes represented by the above formula, definitions of $R_x$ and X are described above.

The above mentioned alkaline-soluble polymer can be prepared by using polymerization methods generally utilized in the art of polymer chemistry. For example, a certain monomer component can be advantageously prepared by heating under the presence of AIBN (2,2'-azobisisobutyronitrile), etc. as for a free radical initiator. Also, an alkaline-soluble polymer except a methacrylate-based polymer can be advantageously prepared similarly by an ordinary method.

In the structure of the resin having high transparency at the deep ultraviolet spectral region or in the additional compound containing an oxetane structure, a high sensitive resist suitable for exposure with deep ultraviolet radiations is obtained, provided that the structure of the resin or the compound is selected properly such that no chromophore having a large molar absorption coefficient in the spectral region of from 150 to 250 nm is contained.

As illustrated before, an oxetane structure performs a ring-open reaction under a certain condition and reacts with an alkaline-soluble group such as a carboxyl group. That is, an oxetane works as a cross-linking agent in the resin under coexistence of an alkaline-soluble resin, and causes the resin to be insolubilized by the increase of the molecular weight of the alkaline-soluble resin. From this reason, the inventors have conceived that the composition including an alkaline-soluble group and an oxetane structure would form a negative resist. Further, an oxetane performs cationic polymerization under a certain condition. Therefore, when a compound containing an oxetane structure shows alkaline-solubility, the alkaline-solubility is lost by cationic polymerization, and the exposed area of the resist is selectively insolubilized. In this way, the inventors also conceived that these compositions would become a negative resist.

In the resist composition according to the present invention, a structure of an alkaline-soluble resin is not limited as far as the resin contains an alkaline-soluble group as described above. As for a single layer resist composition, a phenol resin, an acrylate resin, which are generally used as for the base resin, and a copolymer thereof, and furthermore a silicon-containing resin containing a carboxyl group, a phenolic hydroxide group, and hexafluorocarbinol, etc. can be used. Preferably, a silicon-containing resin represented by the above formula (4) or (5) may be used.

The compound having an oxetane structure represented by the above formula (1) is not limited particularly. With respect to an alkaline-soluble resin and a compound having an oxetane structure, a plural kinds of these may coexist as far as the above mentioned condition is satisfied.

The resist composition according to the present invention becomes a chemical amplification negative resist composition, provided that an alkaline-soluble resin is employed as for the main agent, a compound containing an oxetane structure, if necessary, is used as for the cross-linking agent, and an acid generator is added to the resin.

In the chemical amplification resist according to the present invention, as for a photoacid generator (PAG) used in combination with an acid-reactive polymer described above, a PAG generally used in the art of the resist chemistry can be used. That is, the PAG material generates a protonic acid when it is illuminated with the radiation such as ultraviolet radiation, far ultraviolet radiations, vacuum ultraviolet radiations, electron beams, soft X-rays, X-rays, and the like. PAGs usable in the present invention include the following compounds, although it is not limited.

(1) Salts of onium ions

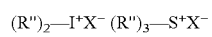

In the above formulas, R" is a substituted or non-substituted aromatic ring or alicyclic group and X is selected from the group consisting of $BF_4$, $PF_6$, $AsF_6$, $SbF_6$, $CF_3SO_3$ and $ClO_4$, etc.

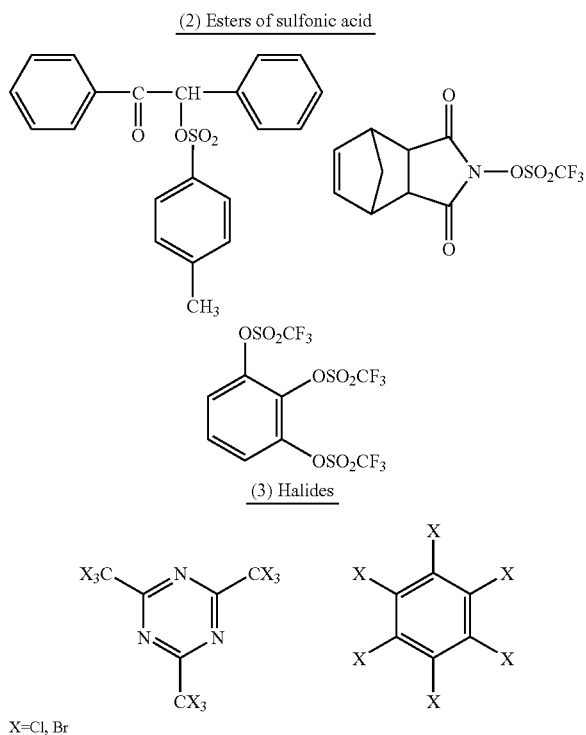

The PAGs are used in various amounts in the resist composition according to the present invention. A content of a PAG is preferably from 0.1 to 50% by weight (percentage to weight of a polymer) and more preferably from 1 to 15% by weight. With respect to the resist composition according to the present invention, particularly, it is preferable to determine structures of a polymer and a PAG and a content of the PAG in order that absorbance at wavelength of exposed light is equal to or less than 1.75.

The resist composition according to the present invention is advantageously utilized as a resist solution prepared by dissolving the above mentioned alkaline-soluble polymer and a PAG in a proper organic solvent. Organic solvents useful to prepare resist solution are ethyl lactate, methyl amyl ketone, methyl-3-methoxypropionate, ethyl-3-ethoxypropionate, and propylene glycol methyl ether acetate, etc., and not limited to them. These solvents may be used independently and, if necessary, equal to or more than two kinds of the solvents may be mixed each other and used. Moreover, although the content-of the solvent is not limited particularly, it is preferable to use the enough quantity to obtain appropriate viscosity of the resist solution for coating such as spin coating, etc. and desirable thickness of a resist film.

In the resist solution according to the present invention, if necessary, a supplementary solvent may be used in addition to the (main) solvent described above. A supplementary solvent may be not required dependent on solubility of a solute and uniformity for coating solution. When a solute having low solubility is employed or uniformity for coating does not satisfy desired condition, additional quantity of the supplementary solvent is preferably from 1 to 30% by weight to a main solvent, and more preferably from 10 to 20% by weight in common. Useful supplementary solvents include, for example, butyl acetate, γ-butyrolactone and propylene glycol methyl ether, etc., although they are not limited to them.

The present invention also provides a method to form a resist pattern, particularly a negative resist pattern, on a substrate by using the above mentioned resist composition. The negative resist pattern according to the present invention can be formed as follows.

At first, the resist composition according to the present invention is applied to a substrate to form a resist film. The substrate may be a substrate generally used in a semiconductor device or another devices such as a MR head, and for example, a silicon substrate, a glass substrate, and non-magnetic ceramics substrate, etc. are given. If necessary, an additional layer such as a silicon oxide layer, metal layer for wiring, an interlayer insulating film layer, and a magnetic film, etc. may be laid and each kind of wiring or circuit may be produced on the substrate. Furthermore, the substrate may be hydrophobized by an ordinary method to improve adhesion of a resist film to the substrate. As for the appropriate primer agent, for example, 1,1,1,3,3,3-hexamethyldisilazane, etc. may be used.

For applying a resist composition, a resist solution described above can be coated on a substrate. As for a method for coating a resist solution, although some ordinary methods such as spin coating, roll coating, and dip coating, etc., may be used, the spin coating is particularly useful. The thickness of the resist film of from 0.01 to 200 μm is recommended. In the case the resist is exposed by means of an excimer laser such as KrF, ArF or $F_2$ laser, the thickness of from 0.05 to 5 μm is recommended. The thickness of the formed resist film can be widely varied corresponding to various factors such as purpose of the resist film.

It is preferable that the resist film applied on a substrate is subjected to a pre-baking process for the duration of 30 to 120 seconds at the temperature of 60 to 180 ° C. before the resist film is exposed to the radiation for imaging. The pre-bake process can be implemented by means of a commonly used heating method. As for the suitable heating method, for example, a hot plate, a heat oven with infrared radiation, or a heat oven with microwave may be employed.

After the pre-baking process, the resist film after is exposed to the radiation for imaging by using a commonly used exposure apparatus. The exposure apparatus may be the one that uses an ultraviolet radiation, a far ultraviolet radiation, a deep ultraviolet radiation, or a vacuum ultraviolet radiation, an X-ray, an electron beam, or suitable radiation available from the market. Particularly, the above mentioned excimer lasers (a KrF laser at the wavelength of 248 nm, an ArF laser at the wavelength of 193 nm, or a $F_2$ laser at the wavelength of 157 nm,) may be advantageously used as for the exposure light source in the present invention. It should be noted that the term "radiation" as used in the specification includes any radiation originating from any kinds of light sources.

After the exposure process, a protection reaction of an alkaline-soluble group is caused by conducting a PEB (post-exposure bake) process on the exposed resist film under the presence of the acid catalyst. The post-exposure baking may be carried out similarly to the case of the pre-baking process explained previously as far as the protection reaction is caused with sufficient degree. For example, the PEB can be carried out for an interval of 30 to about 120 seconds at the temperature of 60 to 180° C. It is particularly preferable that the baking condition is adjusted according to the desired pattern size and form.

After the PEB is performed, the resist film is developed with a basic aqueous solution used as a developer. For the development, a commonly used development apparatus such as a spin developer, a dip developer or a spray developer may be used. In the case a basic aqueous solution is used for the developer, a solution of a metal hydroxide containing a metal classified to group I or group II in the periodic table, such as potassium hydroxide may be used. Alternatively, a solution of an organic base not containing a metal ion such as tetraalkylammonium hydroxide may be used. Particularly, a solution of tetramethylammonium hydroxide (TMAH) is most preferable, and an additive such as a surfactant may added for improving the development effect. As a result of the development, the unexposed area of the resist film is dissolved and removed, while the exposed area remains on the substrate and forms a negative resist pattern.

The foregoing method of forming a resist pattern of the present invention can be applied to a multi-layer resist process as well as the above mentioned single layer resist process. Thus, a negative resist pattern having high aspect ratio is formed on the substrate by using the resist composition of the present invention.

For example, the formation of a negative resist pattern by a bilayer resist process can be implemented according to the following procedure.

First, a first resist composition is applied on the substrate to form a lower layer resist film, and the resist composition according to the present invention is applied on the lower layer resist film to form an upper layer resist. The upper layer resist film is then exposed to the radiation for imaging, and the exposed upper layer resist film is developed with a basic aqueous solution to form a resist pattern, Further, the underlying lower layer resist film on the substrate is etched by using the resist pattern as a mask.

Thereby, the resist pattern on the upper layer is transferred to the lower layer resist film and a resist pattern having a high aspect ratio is obtained by both the lower layer resist film and the upper layer resist film.

More specifically, it is possible to use a conventional, generally used organic material, for the resist composition of the lower resist layer. Thus, it is preferred to use a commercially available resist material such as a novolak resin, a poly(vinyl phenol) resin, and a conductive material based on polyaniline and polythiophene for this purpose. The thickness of the lower resist layer is preferably between 0.1 and 10 μm, more preferably between 0.2 and 1.0 μm.

When applying the resist composition of the present invention, a solvent may be used according to the needs as described above. The solvent and the applying method of the resist composition are the same as described above. The thickness of the resist composition is preferably set between 0.03 and 1.0 μm more preferably between 0.05 and 0.2 μm.

The exposure process and development process are implemented also according to the process explained above. At the time of etching the lower resist layer is etched, a plasma etching process conducted in a oxygen-containing atmosphere may be used. More particularly, the etching gas may comprise oxygen and sulfur oxide. As the plasma etching apparatus, it is possible to use a high-density plasma etching apparatus.

EXAMPLES

The present invention will now be described in greater detail with reference to examples given below. It should be noted that the description hereinafter is no more than examples and is not construed as limiting the invention. In the following examples, explanation will be made on the synthesis method of alkaline-soluble polymers, preparation method the of resist compositions, formation method of the resist patterns, and fabricating method of the semiconductor devices.

Example 1

Synthesis of poly(2-oxetanepropyl methacrylate-co-3-carboxyadamantyl methacrylate)

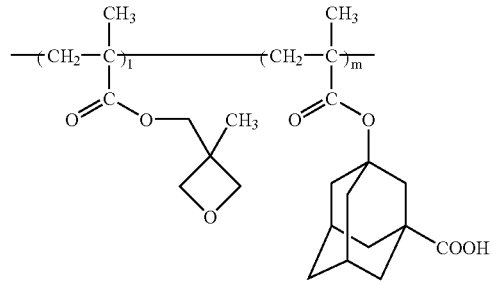

2.14 g (12.57 mmol) of 2-oxetanepropyl methacrylate, 6.15 g (23.35 mmol) of 3-carboxyadamantyl methacrylate, a stirrer bar coated with Teflon (trademark), 24 ml of dioxane, and 885 mg (5.39 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1 l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 6.05 g (73%). The copolymerization ratio of the oxetane to the adamantyl was proved to be 64:36 by means of $^1$H NMR. The weight-averaged molecular weight of the resin was 13,400 and the degree of the dispersion was 1.43.

Example 2

Synthesis of poly(2-oxetanebutyl methacrylate-co-3-carboxyadamantyl methacrylate) (see the following formula)

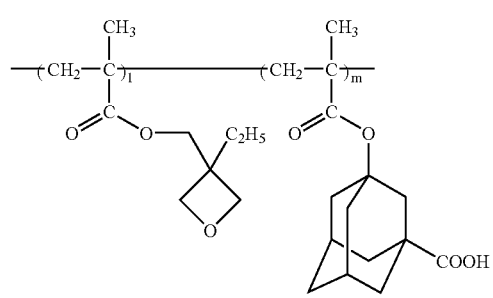

2.32 g (12.57 mmol) of 2-oxetanebutyl methacrylate, 6.15 g (23.35 mmol) of 3-carboxyadamantyl methacrylate, a stirrer bar coated with Teflon, 24 ml of dioxane, and 885 mg (5.39 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1 l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 6.95 g (82%). The copolymerization ratio of the oxetane to the adamantyl was proved to be 65:35 by means of $^1$H NMR. The weight-averaged molecular weight of the resin was 15,800 and the molecular weight dispersion was 1.48.

Example 3

Synthesis of poly(methacrylic acid-co-3-(2'-oxetanepropyloxymethyl)adamantyl methacrylate) (see the following formula)

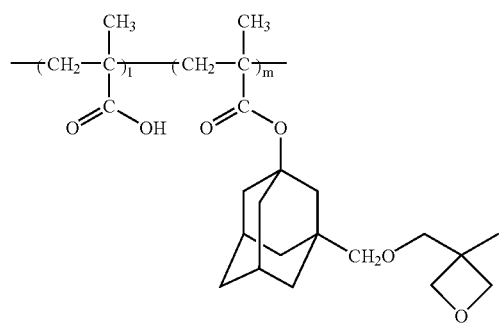

1.09 g (12.57 mmol) of methacrylic acid, 7.81 g (23.35 mmol) of 3-(2'-oxetanepropyloxymethyl)adamantyl methacrylate, a stirrer bar coated with Teflon, 15.5 ml of dioxane, and 885 mg (5.39 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1l of diethyl ether containing small amount of hydroquinone and a precipitate was produced. The precipitate was filtrated through a glass filter and dried for 6 hours at 45° C. and 0.1 mmHg. The obtained white powder was dissolved to. THF again and the precipitation and drying processes described above were repeated twice, to obtain a white powder of a resin with a yield of 5.79 g (65%). The copolymerization ratio of the methacrylic acid to the adamantyl was proved to be 36:64 by means of $^1$H NMR. The weight-averaged molecular weight of the resin was 9,200 and the molecular weight dispersion was 1.50.

Example 4

Synthesis of poly(2-oxetanepropyl acrylate-co-carboxytetracyclododecyl acrylate) (see the following-formula)

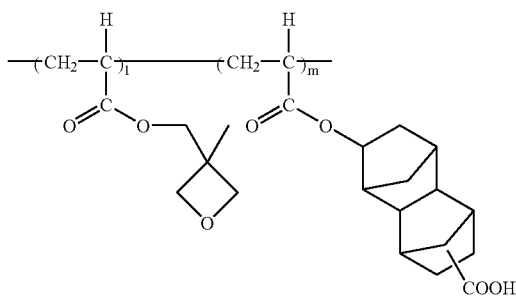

2.08 g (13.33 mmol) of 2-oxetanepropyl acrylate, 5.05 g (20 mmol) of carboxytetracyclododecyl acrylate, a stirrer bar coated with Teflon, 11.1 ml of dioxane, and 821 mg (5 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 600 ml of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 4.88 g (68.5%). The copolymerization ratio of the oxetane to the dodecyl was proved to be 66:34 by means of $^1$H NMR. The weight-averaged molecular weight of the resin was 10,900 and the molecular weight dispersion was 1.42.

Example 5

Synthesis of poly(2-oxetanebutyl methacrylate-co-3-methoxycarbonyladamantyl methacrylate-co-3-carboxyadamantyl methacrylate) (see the following formula)

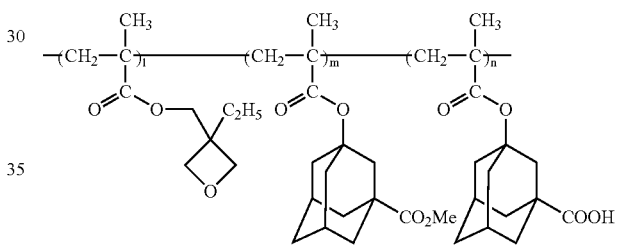

2.95 g (16 mmol) of 2-oxetanebutyl methacrylate, 2.78 g (10 mmol) of 3-methoxycarbonyladamantyl methacrylate, 3.7 g (14 mmol) of 3-carboxyadamantyl methacrylate, a stirrer bar coated with Teflon, 40 ml of dioxane, and 1.97 g (12 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 7.07 g (75%). The copolymerization ratio of the oxetane, the methoxycarbonyladamantyl, and the carboxyadamantyl was proved to be 53:13:34 by means of $^1$H NMR. The weight-averaged molecular weight of the resin was 19,500 and the molecular weight dispersion was 1.52.

Example 6

Synthesis of poly(2-oxetanepropyl methacrylate-co-5-norbornane-2,6-carbolactone methacrylate-co-3-carboxyadamantyl methacrylate) (see the following formula)

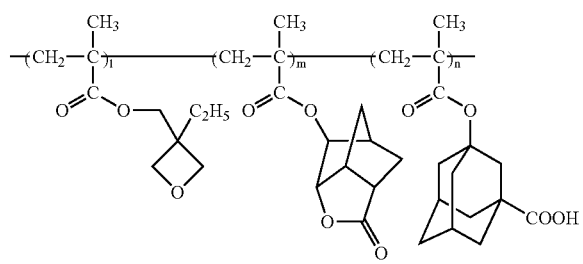

3.40 g (20 mmol) of 2-oxetanepropyl methacrylate, 1.33 g (6 mmol) of 5-norbornane-2,6-carbolactone methacrylate, 3.7 g (14 mmol) of 3-carboxyadamantyl methacrylate, a stirrer bar coated with Teflon, 40 ml of dioxane, and 1.97 g (12 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1 l of diethyl ether containing small amount of hydroquinone and a precipitate was produced. The precipitate was filtrated through a glass filter and dried for 6 hours at 45° C. and 0.1 mmhg. The obtained white powder was dissolved to THF again and the precipitation and drying processes described above were repeated twice, to obtain a white powder of a resin with a yield of 5.41 g (58%). The copolymerization ratio of the oxetane, the norbonyl, and the adamantyl was proved to be 55:11:34 by means of $^1$H NMR. The weight-averaged molecular weight of the resin was 18,700 and the molecular weight dispersion was 1.49.

Example 7

Synthesis of poly(3-(2'-oxetanepropyloxy)adamantyl acrylate-co-3-carboxyadamantyl acrylate) (see the following formula)

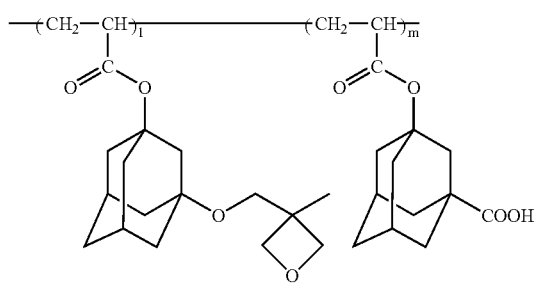

3.06 g (10 mmol) of 3-(2'-oxetanepropyloxy)adamantyl acrylate, 1.25 g (5 mmol) of 3-carboxyadamantyl acrylate, a stirrer bar coated with Teflon, 10 ml of dioxane, and 369 mg (2.25 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 500 ml of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 2.34 g (55%). The copolymerization ratio of the oxetane to the carboxyadamantyl was proved to be 64:36 by means of $^1$H NMR. The weight-averaged molecular weight of the resin was 18,200 and the molecular weight dispersion was 1.41.

Example 8

Synthesis of poly(2-oxetanepropyloxynorbornene-co-maleic anhydride-co-1,1,1-trifluoro-2-trifluoromethyl-2-hydroxypropylnorbornene) (see the following formula)

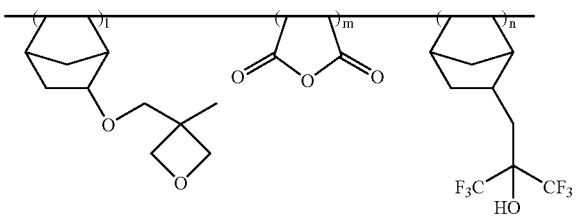

1.92 g (10 mmol) of 2-oxetanepropyloxynorbornene, 0.98 g (10 mmol) of maleic anhydride, 2.62 g (10 mmol) of 1,1,1-trifluoro-2-trifluoromethyl-2-hydroxypropylnorbornene, a stirrer bar coated with Teflon, 20 ml of dioxane, and 493 mg (3 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1 l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 3.42 g (62%). The composition ratio of the monomer units was proved to be 1:1:1 by means of $^1$H NMR. The weight-averaged molecular weight of the resin was 9,400 and the molecular weight dispersion was 1.33.

Example 9

Synthesis of poly(2-oxetanepropyl methacrylate-co-maleic anhydride-co-norbornenecarboxylic acid) (see the following formula)

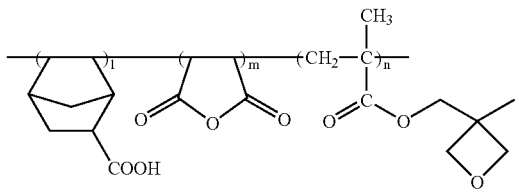

1.70 g (10 mmol) of 2-oxetanepropyl methacrylate, 0.98 g (10 mmol) of maleic anhydride, 1.38 g (10 mmol) of norbornenecarboxylic acid, a stirrer bar coated with Teflon, 20 ml of dioxane, and 493 mg (3 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1 l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 2.35 g (58%). The composition ratio of the monomer units was proved to be 1:1:1 by means of $^1$H NMR. The weight-averaged molecular weight of the resin was 9,100 and the molecular weight dispersion was 1.44.

Example 10

Synthesis of poly(2-oxetanebutyl acrylate-co-hydroxystyrene) (see the following formula)

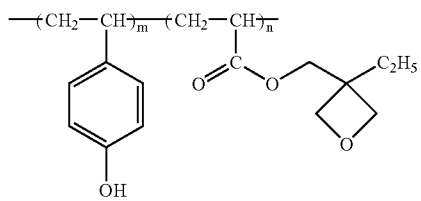

410 mg (2.41 mmol) of 2-oxetanebutyl acrylate, 4.66 g (27.75 mmol) of acetoxystyrene, a stirrer bar coated with Teflon, 10 ml of dioxane, and 743 mg (4.5 mmol) of azobisisobutyronitrile (AIBN) were provided ina 100 ml eggplant-shape flask and stirring was made for 7 hours at 70° C. under nitrogen atmosphere. The reaction solution was diluted with THF. The obtained solution was dropped to 1l of methanol containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated, to obtain a white powder of a resin. The white powder was treated with basic methanol solution to obtain a desired resin with a yield of 2.8 g. The composition ratio of the oxetane to the hydroxystyrene was proved to be 92:8 by means of $^1$H NMR. The weight-averaged molecular weight of the resin was 7,800 and the molecular weight dispersion was 1.33.

Example 11

Synthesis of poly(2-oxetanepropyl methacrylate-co-3,4-carbolactoneadamantyl methacrylate-co-3-carboxyadamantyl methacrylate) (see the following formula)

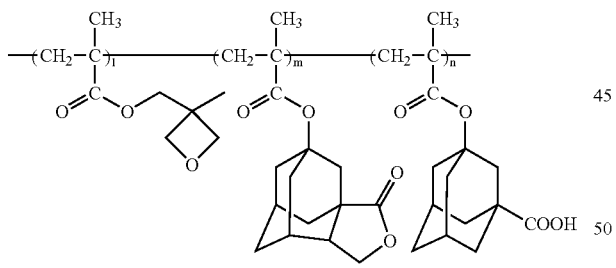

3.40 g (20 mmol) of 2-oxetanepropyl methacrylate, 1.66 g (6 mmol) of 3,4-carbolactoneadamantyl methacrylate, 3.7 g (14 mmol) of 3-carboxyadamantyl methacrylate, a stirrer bar coated with Teflon, 40 ml of dioxane, and 1.97 g (12 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 5.26 g (60%). The copolymerization ratio of the oxetane, the lactone, the adamantyl was proved to be 52:15:33 by means of $^1$H NMR. The weight-averaged molecular weight of the resin was 17,100 and the molecular weight dispersion was 1.41.

Example 12

Synthesis of poly(3-(2-oxetanepropyloxy)adamantyl methacrylate-co-3,4-carbolactoneadamantyl methacrylate-co-3-carboxyadamantyl methacrylate) (see the following formula)

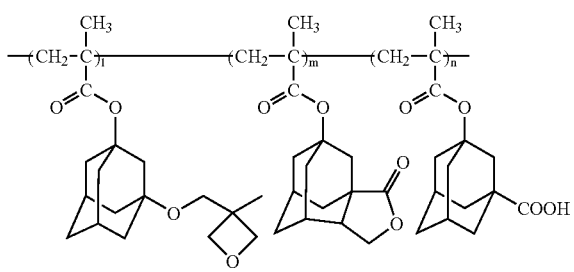

6.17 g (20 mmol) of 3-(2-oxetanepropyloxy)adamantyl methacrylate, 1.66 g (6 mmol) of 3,4-carbolactoneadamantyl methacrylate, 3.7 g (14 mmol) of 3-carboxyadamantyl methacrylate, a stirrer bar coated with Teflon, 40 ml of dioxane, and 1.97 g (12 mmol) of azobisisobuty-ronitrile (AIBN) were provided in a 100 ml eggplant-shape flask and stirring was made for 7 hours at 70° C. under nitrogen atmosphere. The reaction solution was diluted with THF. The obtained solution was dropped to 1l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 8.88 g (77%). The copolymerization ratio of the oxetane, the lactone, the adamantyl was proved to be 54:12:34 by means of $^1$H NMR. The weight-averaged molecular weight of the resin was 21,000 and the molecular weight dispersion was 1.47.

Example 13

Synthesis of poly(3-(2-oxetanebutyloxy)adamantyl methacrylate-co-N-hydroxymethacrylamide-co-methacrylic acid) (see the following formula)

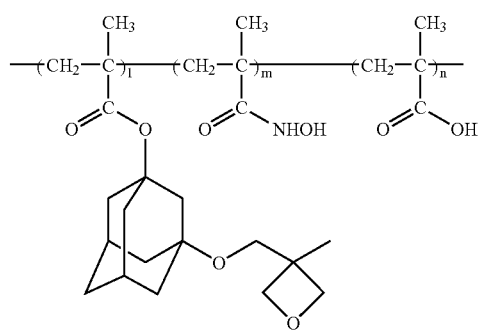

4.82 g (16 mmol) of 3-(2-oxetanebutyloxy)adamantyl methacrylate, 2.02 g (6 mmol) of N-hydroxymethacrylamide, 861 mg (10 mmol) of methacrylic acid, a stirrer bar coated with Teflon, 20 ml of dioxane, and 788 mg (4.8 mmol) of azobisisobutyronitrile (AIBN) were provided in a 100 ml eggplant-shape flask and stirring was made for 7 hours at 70° C. under nitrogen atmosphere. The reaction solution was diluted with THF. The obtained solution was dropped to 1l of diethyl ether containing small amount of hydroquinone and a precipitate was produced. The precipitate was filtrated through a glass filter and dried for 6 hours at 45° C. and 0.1 mmHg. The obtained white powder was dissolved to THF again and the precipitation and drying processes described above were repeated twice, to obtain a white powder of a resin with a yield of 4.47 g (58%). The copolymerization ratio of the adamantyl, the amide, the methacrylic acid was proved to be 65:5:30 by means of $^1$H NMR. The weight-averaged molecular weight of the resin was 9,900 and the molecular weight dispersion was 1.52.

Example 14

The resin synthesized in example 1 was dissolved in EL (ethyl lactate) to prepare 13% by weight of a solution. Herein, the solution also contained 10% by weight of γ-butyrolactone as a supplementary solvent. 2% by weight of triphenylsulfonium trifluoromethanesulfonate was added and sufficiently dissolved to the obtained solution. After the obtained resist solution was filtrated through the Teflon membrane filter with 0.2 μm mesh, the filtrated solution was coated on a substrate subjected to HMDS treatment by means of spin-coating and pre-bake for 60 minutes at 110° C. to form a resist film with thickness of 0.4 μm. After the resist film was exposed by means of a KrF eximer laser stepper (NA=0.45), the film was baked for 60 minutes at 120° C., developed with 2.38% of tetramethylammomium hydroxide (TMAH) as a developer, and rinsed with a deionized water. 0.25 μm L/S of the resist pattern could be resolved in the condition of 17.0 mJ/cm$^2$ of the light exposure.

Example 15

A resist film with thickness of 0.4 μm was formed using the resist synthesized in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 9.0 mJ/cm$^2$ of the light exposure.

Example 16

A resist film with thickness of 0.4 μm was formed using the resin synthesized in example 2 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 12.0 mJ/cm$^2$ of the light exposure.

Example 17

A resist film with thickness of 0.4 μm was formed using the resin synthesized in example 3 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 11 mJ/cm$^2$ of the light exposure.

Example 18

A resist film with thickness of 0.4 μm was formed using the resin synthesized in example 4 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 14 mJ/cm$^2$ of the light exposure.

Example 19

A resist film with thickness of 0.4 μm was formed using the resin synthesized in example 5 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 8 mJ/cm$^2$ of the light exposure.

Example 20

A resist film with thickness of 0.4 μm was formed using the resin synthesized in example 6 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 9 mJ/cm$^2$ of the light exposure.

Example 21

A resist film with thickness of 0.4 μm was formed using the resin synthesized in example 7 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 8 mJ/cm$^2$ of the light exposure.

Example 22

A resist film with thickness of 0.4 μm was formed using the resin synthesized in example 6 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 18 mJ/cm$^2$ of the light exposure.

Example 23

A resist film with thickness of 0.4 μm was formed using the resin synthesized in example 6 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 14 mJ/cm$^2$ of the light exposure.

Example 24

A resist film with thickness of 0.4 μm was formed using the resin synthesized in example 10 in the manner as similar to that in example 14. After the resist film was exposed by means of a KrF excimer laser stepper (NA=0.68), the film was baked for 60 minutes at 110° C., developed with 2.38% of a TMAH developer, and rinsed with a deionized water. 0.18 μm L/S of the resist pattern could be resolved in the condition of 13 mJ/cm² of the light exposure.

Example 25

A resist was prepared by adding 10% by weight of poly(2-oxetanepropyl methacrylate) (molecular weight: 5,600) to poly(hydroxystyrene) followed by dissolution in EL. After a resist film with thickness of 0.4 μm was formed and exposed by means of a KrF excimer laser stepper (NA=0.68), the film was baked for 60 minutes at 110° C., developed with 2.38% of a TMAH developer, and rinsed with a deionized water. 0.22 μm L/S of the resist pattern could be resolved in the condition of 15 mJ/cm² of the light exposure.

Example 26

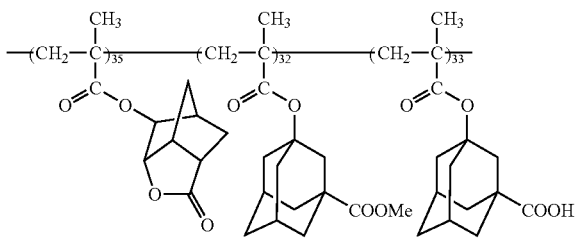

A resist was prepared by adding 12% by weight of poly(2-oxetanepropyl methacrylate) (molecular weight: 5,600) to the resin represented by the above structural formula (molecular weight: 9,500) followed by dissolution in EL. After a resist film with thickness of 0.4 μm was formed and exposed by means of a ArF excimer laser stepper (NA=0.60), the film was baked for 60 minutes at 110° C., developed with 2.38% of a TMAH developer, and rinsed with a deionized water. 0.16 μm L/S of the resist pattern could be resolved in the condition of 17 mJ/cm² of the light exposure.

Example 27

A resist film with thickness of 0.4 μm was formed using the resin synthesized in example 11 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 13 mJ/cm² of the light exposure.

Example 28

A resist film with thickness of 0.4 μm was formed using the resin synthesized in example 12 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 12 mJ/cm² of the light exposure.

Example 29

A resist film with thickness of 0.4 μm was formed using the resin synthesized in example 13 in the manner as similar to that in example 14. After the resist film was exposed by means of a ArF excimer laser stepper (NA=0.60), the film was baked for 60 minutes at 120° C., developed with 2.38% of a TMAH developer, and rinsed with a deionized water. 0.15 μm L/S of the resist pattern could be resolved in the condition of 18 mJ/cm² of the light exposure.

Example 30

A resist film with thickness of 1 μm was formed on a silicon substrate using the resist synthesized in examples 5, 7, 8, 10, 26 and 28. For comparison, PMMA (poly(methyl methacrylate)) and PFI-16 (provided from Sumitomo Chemical), which are commercially available novolac resists, were etched for 5 minutes under the condition of Pμ=200W, pressure=0.02 Torr, and CF₄ gas=100 sccm in a parallel flat plate type RIE apparatus. The amounts of decrease of the sample films were compared and the results listed in following table.1 were obtained.

TABLE 1

| Resist | Etching rate (A/s) | Ratio of rate |
|---|---|---|
| PFI-16 | 510 | 1.00 |
| PMMA | 760 | 1.49 |
| Example 5 | 622 | 1.22 |
| Example 7 | 495 | 0.97 |
| Example 8 | 612 | 1.20 |
| Example 10 | 561 | 1.10 |
| Example 26 | 627 | 1.23 |
| Example 28 | 479 | 0.94 |

As the result listed in above table.1, etching resistance of the resist according the present invention was similar to that of the novolac resists. Particularly, the resists described in examples 7 and 28 had compositions available against ArF exposure and resistance more than that of the novolac resists. From the experiment, it was confirmed that all resists were very superior to PMMA. Also, occurrence of swelling was not found in a resist pattern in examples 5, 7, 8, 10, 26 and 28.

Example 31

Synthesis of a silicon-containing resin

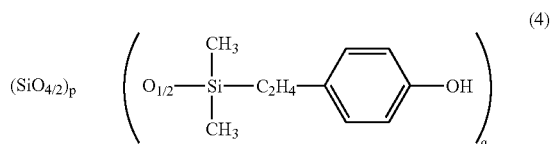

(4)

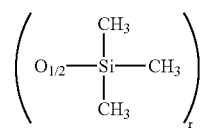

To a four-neck flask provided with a condensor and a thermometer 6.9 g (0.023 mole) of 1,3-bis(carboxypropyl)tetramethyldisiloxane, 35 ml of a purified water and 20.6 ml of acetic acid were added under nitrogen atmosphere. The reaction mixture was stirred and raised to a temperature of 60° C. in an oil bath. 12.48 g (0.06 mole) of tetraethoxysilane was added to the mixture dropwise for 30 minutes and the mixture was reacted for one hour. 6.24 g (0.03 mole) of tetraethoxysilane was then added to the mixture for 30 minutes and the mixture was reacted for 3 hours. After the reaction mixture was cooled to room temperature, the reaction solution was transferred to a separatory funnel. 100 ml of water and 100 ml of methyl isobutyl ketone (MIBK) were added to the separatory funnel and solvent extraction was performed. An organic layer was filtrated with a liquid layer separating filter paper and was transfer the four-neck flask. Water was removed by azeotropic distillation to yield a MIBK solution containing a four-functional siloxane resin.

Next, to the four-neck flask equipped with the condenser and the thermometer, a half-concentrated MIBK solution and 100 ml of tetrahydrofuran was added and 12.0 g (0.84 mole) of trimethylsilylimidazole was then added while stirring at room temperature. The mixture was reacted for two hours. 18 ml of hydrochloric acid was added to the mixture and the reaction mixture was filtrated with the liquid layer separating filter paper and was transferred into the four-neck flask. Water was removed by azeotropic distillation. Freeze drying was carried out with dioxane for a component which was precipitated with hexane after the solution had been concentrated, to give a desired silicon-containing resin having a molecular weight of 6,000 with a yield of 85%.

Example 32

100 parts by weight of the alkaline-soluble silicon-containing resin represented by formula (4) synthesized in example 31, 100 parts by weight of silicon-containing resin having the molecular weight of 3000 and the oxetane structure represented by the following formula (5)(which was synthesized by a synthesizing method disclosed in Japanese Laid-Open Patent Application No. 6-16804) and 5 parts by weight of triphenylsulfonium triflate were dissolved in propylene glycol monomethyl ether acetate (PGMEA) so as to prepare a resist solution.

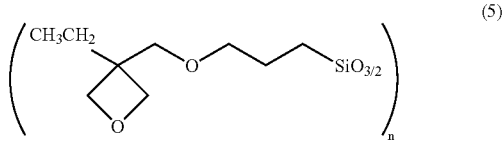

(5)

The resist solution was spin-coated on a Si substrate which was pre-subjected to hexamethyldisilazane treatment and prebaking was performed at 100° C. for 60 seconds to form a resist film having the thickness of 0.14 μm. After exposing the resist film by means of the KrF excimer laser stepper (NA=0.45), baking was carried out at 135° C. for 60 seconds. Development of the resist film with 2.38% of TMAH resulted in formation of a line and space of 0.25 μm with an exposure amount of 7 mJ/cm$^2$.

Example 33

100 parts by weight of the alkaline-soluble silicon-containing resin having the molecular weight of 6000 which is represented by formula (4) and was synthesized in example 31, 70 parts by weight of silicon-containing resin having the molecular weight of 3000 and the oxetane structure represented by the above formula (3) and 3 parts by weight of triphenylsulfonium triflate were dissolved in MIBK so as to prepare a resist solution.

First of all, a solution based on a novolak resin was spin-coated on the Si substrate and baking was carried out in an oven at 280° C. for 3 hours to form the lower resist layer having the thickness of 0.4 μm. The resist solution thus prepared above was then spin-coated on the lower resist layer and prebaking was performed at 110° C. for 60 seconds to form the upper resist layer having the thickness of 0.1 μm. After exposure of the obtained resist layer having bilayer structure by means of the ArF excimer laser exposing apparatus, baking was carried out at 140° C. for 60 seconds. Development of the resist film with 2.38% of TMAH resulted in formation of a line and space of 0.17 μm with an exposure amount of 10 mJ/cm$^2$.

Example 3

The upper pattern was transferred to the lower resist layer by means of O$_2$-RIE using the upper resist pattern formed in Example 33 as the mask. The conditions of O$_2$-RIE is as follows: RF power; 0.16 W/cm$^2$, oxygen flow; 10 sccm, gas pressure; 10 mTorr. The results of etching rate is shown FIG. 1. Under these conditions O$_2$-RIE resistance of the upper resist was 100 times that of the lower resist. As a result, it was confirmed that a line and space pattern of 0.17 μm which was formed in the upper resist layer was successfully transferred to the lower resist layer without dimensional variation.

Example 35

100 parts by weight of the alkaline-soluble silicon-containing resin having the molecular weight of 6000 and being represented by the formula (4), 50 parts by weight of silicon-containing resin having the molecular weight of 3000 and the oxetane structure represented by the above formula (3) and 5 parts by weight of triphenylsulfonium triflate were dissolved in methyl isobutyl ketone (MIBK) so as to prepare a resist solution.

As similar to example 33, the lower resist layer was formed on the Si substrate so that the thickness was 0.4 μm. Subsequently, the resist solution thus prepared above was spin-coated on the lower resist layer and prebaking was carried out at 110° C. for 60 seconds to form the upper resist layer having the thickness of 0.1 μm. After exposure of the obtained resist layer having bilayer structure by means of the electron beam exposing apparatus, baking was carried out at 135° C. for 60 seconds and development of the resist film with 2.38% of TMAH aqueous solution resulted in formation of a line and space of 0.125 μm with an exposure amount of 45° C. C/cm$^2$.

Example 36

The upper pattern was transferred to the lower resist layer by means of O$_2$-RIE using the upper resist pattern formed in Example 35 as the mask. Under the same conditions as in Example 34 O$_2$-RIE resistance of the upper resist was about 90 times that of the lower resist. As a result, it was confirmed that a line and space pattern of 0.125 μm which was formed in the upper resist layer was successfully transferred to the lower resist layer without dimensional variation.

Example 37

A more specific method for fabricating the semiconductor device will be described below using the resist composition according to the present invention.

Figure 2A:
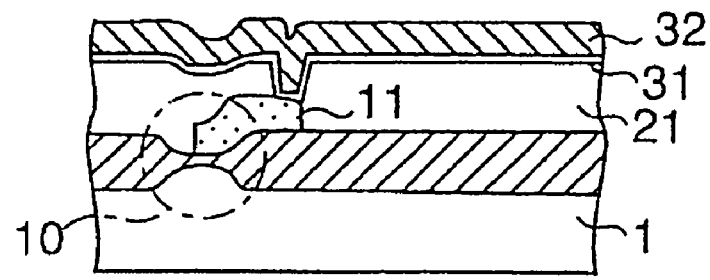
FIGS. 2A through 2C are diagrams showing the process steps of forming a wiring pattern while using the resist composition of the present invention sequentially.
Figure 2B:
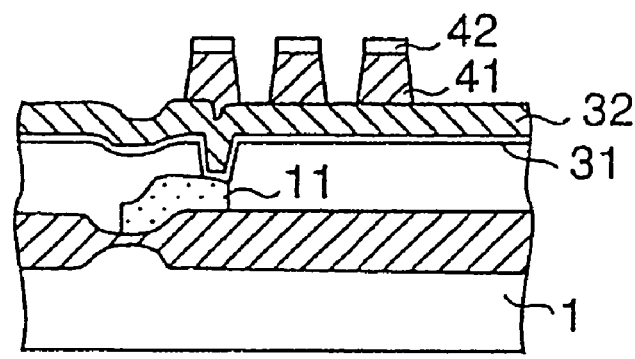
Figure 2C:
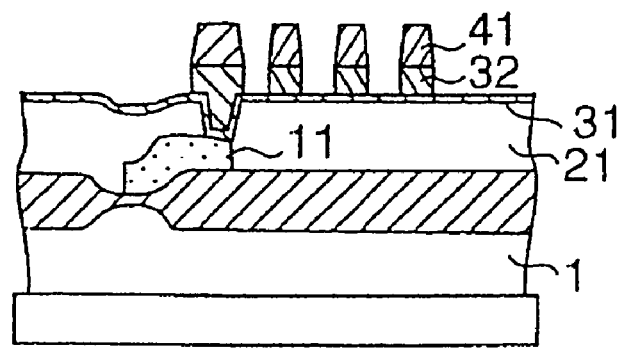

FIGS. 2A–2C show a forming method of a wiring pattern of a gate necessary for a high aspect ratio in order. An isolated MOS transistor 10 is provided on a silicon substrate 1 by means of field oxidation. An insulating layer 21 is formed on a gate electrode 11 of the MOS transistor and an opening is formed by means of a lithographic means in order to draw a wiring from the gate electrode 11. As a barrier metal, a thin film 31 of titanium nitride (TiN) is then formed on the insulating layer 21 and a thin film 32 made from Al as a wiring material is deposited on the TiN film (See, FIG. 2A).

In order to process this Al/TiN layers as the wiring pattern, a resist pattern 42 is formed thereon as an etching mask according to a procedure described in Example 32. The obtained resist pattern is then transferred to a lower layer by means of an oxygen plasma etching method using resist pattern 42 as the mask (See, FIG. 2B). Then, the resist pattern 42 is then removed by fluorine-based plasma etching to form an etching mask 41.

By use of the etching mask 41, the Al/TiN stacked layer is etched by means of chlorine-based plasma so as to provide a gate wiring pattern having the high aspect ratio (See, FIG. 2C).

The present invention is not limited to the specifically disclosed embodiments, and variation and modifications may be made without departing from scope of the present invention.

The present invention is based on Japanese priority applications No. 2000-089790 filed on Mar. 28, 2000, and No. 2001-093727 filed on Mar.28, 2001, the entire contents of which are hereby incorporated by reference.

What is claimed is:

1. A negative resist composition containing an alkaline-soluble resin as a base material, in which an oxetane structure represented by the following formula (1):

 (1)

is contained in a structure of the alkaline-soluble resin.

2. The negative resist composition as claimed in claim 1, further comprising a photoacid generator which generates an acid reactive to the oxetane structure when said acid has absorbed radiation used for imaging a pattern and has caused dissociation, said resin being soluble to a basic aqueous solution, wherein an exposed area of said resin exposed to said radiation becomes alkaline-insoluble so that said negative resist composition can be developed with a basic aqueous solution.

3. The negative resist composition as claimed in claim 1, wherein said alkaline-soluble resin is a polymer containing at least one substituent selected from the group consisting of a carboxyl group, a phenolic hydroxyl group, an N-hydroxyamide group, an oxime group, an imide group, a sulfonic acid group and a 1,1,1,3,3,3-hexafluorocarbinol group represented by the following formula (2):

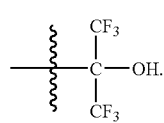 (2)

4. The negative resist composition as claimed in claim 3, wherein said alkaline-soluble resin is a silicon-containing resin.

5. The negative resist composition as claimed in claim 4, wherein said silicon-containing resin is a silicon containing resin represented by the formula (3):

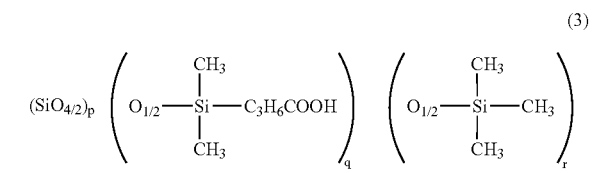 (3)

or the formula (4):

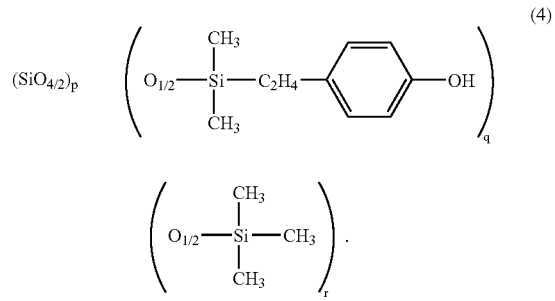 (4)

6. The negative resist composition as claimed in claim 1, wherein said alkaline-soluble resin is a polymer derived from one or more of the monomer selected from the group consisting of acrylic acid, methacrylic acid, itaconic acid, vinylbenzoic acid, norbornene, vinylphenol, styrene and a derivative thereof.

7. The negative resist composition as claimed in claim 1, wherein said alkaline-soluble resin is a polymer containing at least one of a weak alkaline-soluble group selected from the group consisting of a lactone-ring, an imide-ring and an acid anhydride.

8. The negative resist composition as claimed in claim 1, wherein the alkaline-soluble resin is a polymer comprising a polycyclic alicyclic hydrocarbon group.

9. The negative resist composition as claimed in claim 8, wherein said polycyclic alicyclic hydrocarbon group comprises a member selected from the group consisting of an adamantyl group, a norbornyl group and a bicyclo[2.2.2]octyl group.

10. The negative resist composition as claimed in claim 9, wherein said polycyclic alicyclic hydrocarbon group comprises at least one alkoxycarbonyl group or ketone group independently or in combination.

11. The negative resist composition as-claimed in claim 1, wherein absorbance thereof at the wavelength of the radiation emitted from an exposure source is equal to or less than 1.75.

12. The negative resist composition as claimed in claim 1, wherein said negative resist composition contains a solvent selected from the group consisting of ethyl lactate, methyl amyl ketone, methyl 3-methoxypropionate, ethyl 3-ethoxypropionate and propylene glycol methyl ether acetate independently or in combination.

13. The negative resist composition as claimed in claim 12, wherein said negative resist composition contains a solvent selected from the group consisting of butyl acetate, γ-butyrolactone and propylene grycol methyl ether as for a supplementary solvent.

14. A negative resist composition comprising an alkaline-soluble resin as a base material and a polymer having a monomer unit comprising an oxetane structure and used in combination with the alkaline-soluble resin, which monomer unit comprising an oxetane structure comprises a structure represented by

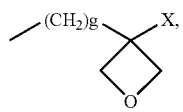

in which g is an integer of from 0 to 4, X is a hydrogen atom or an alkyl group having 8 or less carbon atoms, and each of carbon atoms directly adjacent to the oxygen of the oxetane structure bonds two hydrogen atoms,
wherein said alkaline-soluble resin is a polymer containing at least one of a weak alkaline-soluble group selected from the group consisting of a lactone-ring and an imide-ring.

15. The negative resist composition as claimed in claim 14 further comprising a photoacid generator which generates an acid reactive to the oxetane structure when said acid has absorbed radiation used for imaging a pattern and has caused dissociation, said resin being soluble to a basic aqueous solution, wherein an exposed area of said resin exposed to said radiation becomes alkaline-insoluble so that said negative resist composition can be developed with a basic aqueous solution.

16. The negative resist composition as claimed in claim 14, wherein said alkaline-soluble resin is a polymer containing at least one substituent selected from the group consisting of a carboxyl group, a phenolic hydroxyl group, anN-hydroxyamide group, an oxime group, an imide group, a sulfonic acid group and a 1,1,1,3,3,3-hexafluorocarbinol group represented by the following formula (2):

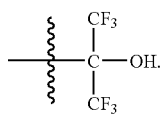

17. The negative resist composition as claimed in claim 14, wherein said alkaline-soluble resin is a polymer derived from one or more of the monomer selected from the group consisting of acrylic acid, methacrylic acid, itaconid acid, vinylbenzoic acid, norbomene, vinylphenol, styrene and a derivative thereof.

18. The negative resist composition as claimed in claim 14, wherein absorbance thereof at the wavelength of the radiation emitted from an exposure source is equal to or less than 1.75.

19. The negative resist composition as claimed in claim 14, wherein said negative resist composition contains a solvent selected from the group consisting of ethyl lactate, methyl amyl ketone, methyl 3-methoxypropionate, ethyl 3-ethoxypropionate and propylene glycol methyl ether acetate independently or in combination.

20. The negative resist composition as claimed in claim 19, wherein said negative resist composition contains a solvent selected from the group consisting of butyl acetate, γ-butyrolactone and propylene glycol methyl ether as for a supplementary solvent.

21. A negative resist composition containing comprising an alkaline-soluble resin as a base material and a polymer having a monomer unit comprising an oxetane structure and used in combination with the alkaline-soluble resin, which monomer unit comprising an oxetane structure comprises a structure represented by

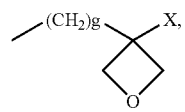

in which g is an integer of from 0 to 4, and X is a hydrogen atom or an alkyl group having 8 or less carbon atoms, and each of carbon atoms at directly adjacent to the oxygen of the oxetane structure bonds two hydrogen atoms, wherein the alkaline-soluble resin is a polymer comprising a polycyclic alicyclic hydrocarbon group.

22. The negative resist composition as claimed in claim 21, wherein said polycyclic alicyclic hydrocarbon group comprises a member selected from the group consisting of an adamantly group, a norbornyl group and a bicyclo[2.2.2]octyl group.

23. The negative resist composition as claimed in claim 21, further comprising a photo acid generator which generates an acid reactive to the oxetane structure when said acid has absorbed radiation used for imaging a pattern and has caused dissociation, said resin being soluble to a basic aqueous solution, wherein an exposed area of said resin exposed to said radiation becomes alkaline-insoluble so that said negative resist composition can be developed with a basic aqueous solution.

24. The negative resist composition as claimed in claim 21, wherein said alkaline-soluble resin is a polymer containing at least one substituent selected from the group consisting of a carboxyl group, a phenolic hydroxyl group, an N-hydroxyamide group, an oxime group, an imide group, a sulfonic acid group and a 1,1,1,3,3,3-hexafluorocarbinol group represented by the following formula (2):

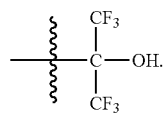

25. The negative resist composition as claimed in claim 21, wherein said alkaline-soluble resin is a polymer derived from one or more of the monomer selected from the group consisting of acrylic acid, methacrylic acid, itaconic acid, vinylbenzoic acid, norbomene, vinylphenol, styrene and a derivative thereof.

26. A negative resist composition containing comprising an alkaline-soluble resin as a base material and a polymer having a monomer unit comprising an oxetane structure and used in combination with the alkaline-soluble resin, which monomer unit comprising an oxetane structure comprises a structure represented by

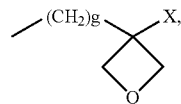

(1)

in which g is an integer of from 0 to 4, and X is a hydrogen atom or an alkyl group having 8 or less carbon atoms, and each of carbon atoms at directly adjacent to the oxygen of the oxetane structure bonds two hydrogen atoms, wherein the alkaline-soluble resin is a polymer comprising a polycyclic alicyclic hydrocarbon group, said polycyclic alicyclic hydrocarbon group comprising a member selected from the group consisting of an adamantly group, a norbornyl group and a bycyclo [2.2.2]octyl group, and at least one alkoxycarbonyl group or ketone group independently or in combination.

27. A negative resist composition containing an alkaline-soluble resin as a base material, in which an oxetane structure represented by the following formula (1):

(1)

is contained in a structure of a compound used in combination with the alkaline-soluble resin, wherein said alkaline-soluble resin is a silicon-containing resin containing at least one substituent selected from the group consisting of a carboxyl group, a phenolic hydroxyl group, an N-hydroxyamide group, an oxime group, an imide group, a sulfonic acid group and a 1,1,1,3,3, 3-hexafluorocarbinol group represented by the following formula (2):

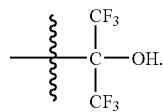

(2)

28. The negative resist composition as claimed in claim 27, wherein said silicon-containing resin is a silicon containing resin represented by the formula (3):

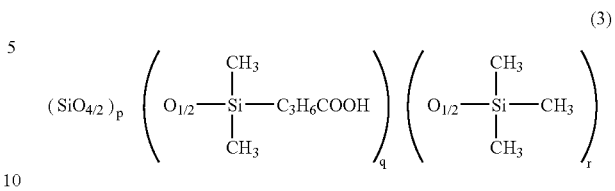

(3)

or the formula (4)

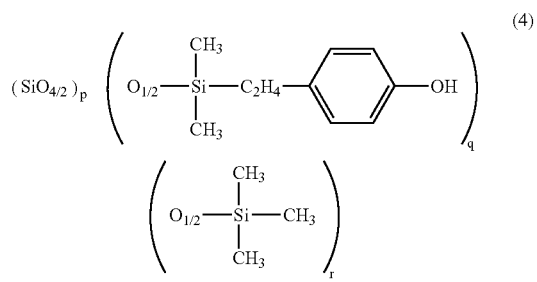

(4)

29. A negative resist composition containing an alkaline-soluble resin as a base material, in which an oxetane structure presented by the following formula (1):

(1)

is contained in a structure of a compound used in combination with the alkaline-soluble resin, wherein said compound is a silicon-containing polymer represented by the formula (5):

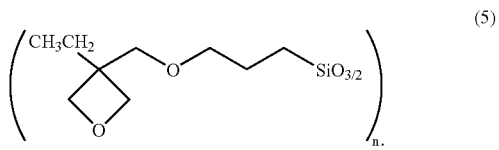

(5)

* * * * *